United States Patent [19]

Chan et al.

[11] Patent Number: 4,701,695
[45] Date of Patent: Oct. 20, 1987

[54] SHORT DETECTOR FOR PROMS

[75] Inventors: Albert Chan; Mark Fitzpatrick, both of San Jose; Don Goddard, Cupertino; Robert J. Bosnyak, Los Gatos; Cyrus Tsui, San Jose, all of Calif.

[73] Assignee: Monolithic Memories, Inc., Santa Clara, Calif.

[21] Appl. No.: 829,260

[22] Filed: Feb. 14, 1986

Related U.S. Application Data

[62] Division of Ser. No. 564,642, Dec. 22, 1983, Pat. No. 4,595,875.

[51] Int. Cl.$^4$ .................. G01R 31/02; G06F 11/00
[52] U.S. Cl. .................. 324/510; 324/73 PC; 371/20; 371/21
[58] Field of Search .......... 324/73 PC, 73 AT, 73 R, 324/51, 133; 371/20, 21, 15

[56] References Cited

U.S. PATENT DOCUMENTS

| | | | |
|---|---|---|---|
| 3,712,537 | 1/1973 | Carita | 371/21 |
| 4,191,996 | 3/1980 | Chesley | 324/73 PC X |
| 4,502,131 | 2/1985 | Giebel | 371/21 X |
| 4,503,538 | 3/1985 | Fritz | 371/21 |
| 4,519,076 | 5/1985 | Priel et al. | 374/73 AT X |

OTHER PUBLICATIONS

Logue et al, Programmable Logic Array Error Detection and Error Correction, Jul. 1976, IBM Tech. Disc. Bul., vol. 19, No. 2, pp. 588-589.

Primary Examiner—Reinhard J. Eisenzopf
Assistant Examiner—Jack B. Harvey
Attorney, Agent, or Firm—Kenneth E. Leeds; Alan H. MacPherson; Paul J. Winters

[57] ABSTRACT

Test circuitry is included in a PROM memory for detecting shorts between bit lines and word lines and shorts or leaks in a memory cell. The circuitry enables a selected positive voltage to be applied across all memory cells in the memory so that the existence of leaky memory cells or shorts in the memory can be detected during testing. The test circuitry has no appreciable effect on the memory during normal operation of the memory.

8 Claims, 5 Drawing Figures

SHORT DETECTOR FOR PROMS

This application is a division of application Ser. No. 564,642 filed Dec. 22, 1983, now U.S. Pat. No. 4,595,875.

BACKGROUND OF THE INVENTION

1. Field of the Invention

This invention relates to circuitry for the detection of shorts or leaky junctions in programmable read only memories (PROMs).

2. Description of the Prior Art

A programmable read only memory (PROM) is a memory in which information is permanently stored in each memory cell of the memory by a programming process. The programming process is performed by the user after fabrication is complete, in contrast to the programming of ROMS by the manufacturer during the fabrication process.

A short or a leaky junction in a PROM cannot be detected by existing design by the manufacturer prior to shipment. Such a short or leaky junction may cause underprogramming, i.e., one or more memory cells may fail to program when the user attempts to program the PROM. Such a short or leaky junction may also cause overprogramming, i.e., when a programming current is applied to a selected memory cell, one or more different cells may be unintentionally programmed. Because the programmming of such PROMS is generally performed by the end user, the manufacturer may become aware of low yields only when the PROM's are rejected by the user.

FIG. 1 illustrates a typical prior art PROM in which the memory includes a rectangular array $x_{ij}$ of NPN transistors and associated fuses $f_{ij}$ connected between word lines $W_j$ and bit lines $B_i$ for $i=1, \ldots, N; j=1, \ldots M$. Prior to programming, each memory cell which includes the transistor $x_{ij}$ and its associated fuse $f_{ij}$ stores a logical 0, i.e., the fuse $f_{ij}$ is not open. A leaky base emitter junction of an NPN transistor or a short between a bit line and a word line may result in a fuse which fails to open when a programming current is attempted to be applied to the fuse. A typical titanium-tungsten (TiW) fuse used in many PROMS requires approximately 3 volts across the fuse in order to produce the approximately 50 milliampere (mA) current required to open the fuse. During normal operation (i.e., reading) of the PROMs the maximum supply voltage, (Vcc), is approximately 5.5 volts, and there is not enough voltage across the fuse to cause the 50 mA of current required to open the fuse.

Accordingly, one of the steps of the programming procedure is to raise the supply voltage Vcc to approximately 12 volts, well above the levels used during reading the PROM. A memory cell to be programmed containing the array transistor $x_{ij}$ is selected by selecting the word line $W_j$ and the bit line $B_i$. The selected word line and thus the base of the selected transistor $x_{ij}$ is at approximately 8 volts, a voltage level determined by internal clamping circuitry (not shown). The remaining deselected word lines are at approximately 1 volt. The base emitter voltage, $V_{BE}$, of the selected array transistor $x_{ij}$ at a base emitter current of 50 mA is approximately 1.5 volts. So, the emitter of the array transistor $x_{ij}$, which is connected to one end of its associated fuse $f_{ij}$, is at a voltage of approximately 8 volts-1.5 volts=6.5 volts. The programming circuit (not shown) holds the voltage on the selected bit line $B_i$ on the other end of the fuse $f_{ij}$ at approximately 1.5 volts if the fuse is to open to store a logical one. Therefore, the voltage across the fuse $f_{ij}$ is approximately 6.5 volts—1.5 volts=5.0 volts which will cause a current greater than 50 mA which will cause the fuse to open, thereby storing a logical one.

Conversely, if the fuse $f_{ij}$ is not to be opened and the cell is to store a logical zero, the bit line $B_i$ is held to approximately 7 volts, so that the voltage drop across the fuse $f_{ij}$ is insufficient to cause a current which will cause the fuse to open.

The array transistor $x_{ij}$ provides to its associated fuse $f_{ij}$ a programming current of 50 mA by amplifying the base current supplied to it through transistor $x_j$ (the "word driver"). If an emitter-base (EB) junction of an array transistor $x_{ij}$ to be programmed is shorted or has a sufficiently large leakage current, or if there is a short between its word line $W_j$ and its bit line $B_i$, the drive current supplied by word driver $x_j$ is not sufficient to provide enough current to cause the fuse to open.

On the other hand, a short between the base of an array transistor and its associated bit line may cause unintentional programming of another cell on the same bit line. For example, suppose there is a short between the base of transistor $X_{JM}$ (Shown in FIG. 1) and bit line $B_1$. If word line $W_1$ is then brought high with the intent of programming transistor $x_{N1}$, fuse $f_{11}$ may unintentionally be opened by current flowing along the following path: from word line $W_1$, through the base emitter junction of transistor $x_{11}$, through fuse $f_{11}$ to bit line $B_1$, from bit line $B_1$ through the short between bit line $B_1$ and the base of transistor $x_{JM}$, to decode diode $D_m^*$, and from decode diode $D_m^*$ through buffer transistor $F_1$ to ground. This will cause the undesired programming (opening) of fuse $f_{11}$.

Prior art PROMs do not contain circuitry to detect the existence of these shorts and therefore since PROMs are typically programmed by the user, defective unprogrammed units may be shipped to the user. This problem does not arise for read-only-memories (ROMs) since these are typically programmed by a mask pattern as a part of the manufacturing process and hence can be tested by the manufacturer prior to shipment.

SUMMARY

This invention includes fault detection circuitry incorporated into a programmable read only memory so that a selected positive voltage can be applied across each memory cell to allow the detection, prior to programming, of shorts between bit lines and word lines and shorts or leaks in a memory cell. By measuring the current flowing into the bit lines, shorts or leaky junctions within memory cells can be detected in unprogrammed devices prior to shipment by the manufacturer. The fault detection circuitry is isolated from the memory during normal operation of the memory, thereby having no adverse effect on the operation of the device.

DETAILED DESCRIPTION

The following description refers to a memory array including NPN transistors and associated addressing circuitry. It will become readily apparent to those of ordinary skill in the art in light of the teachings of this invention that many other embodiments are possible and the following description is intended to be exemplary and not limiting.

Figure 1:
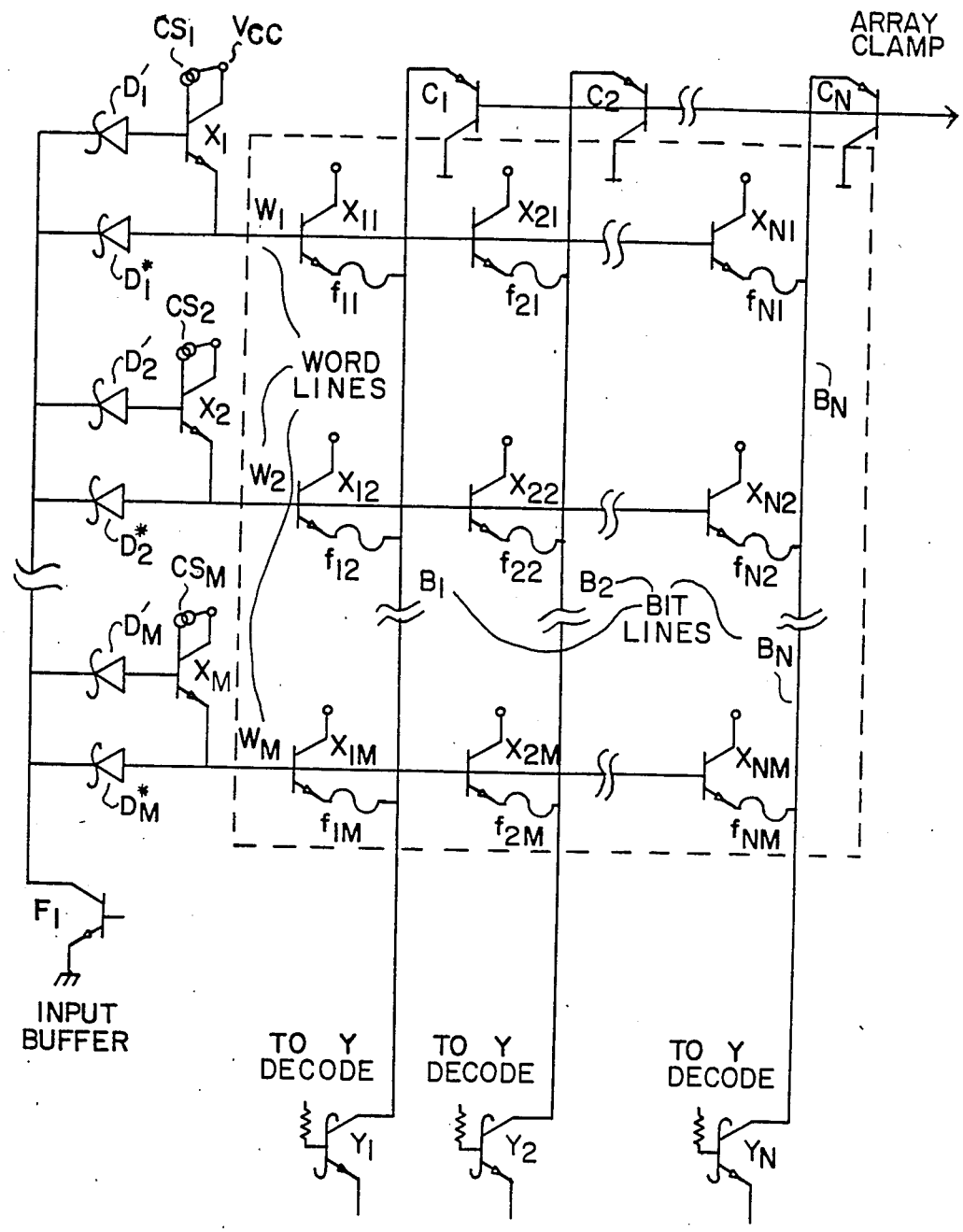
FIG. 1 shows a prior art memory array using NPN transistors.
Figure 2:
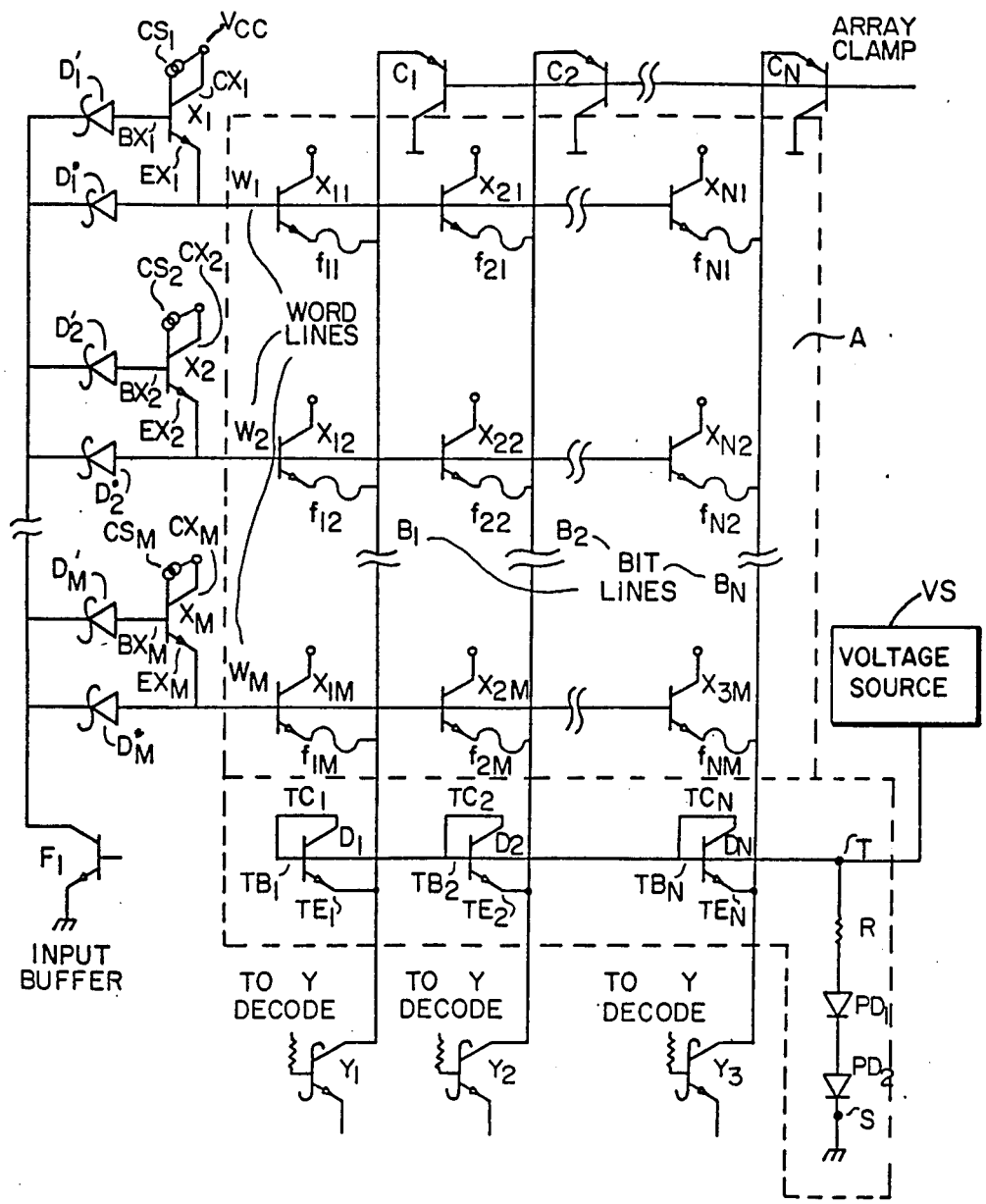
FIG. 2 shows one embodiment of the short detecting circuitry of this invention in a memory array.

FIG. 2 shows a memory array of NPN transistors $x_{ij}$, $i=1, \ldots, N$, $j=1, \ldots, M$ with the emitter of $x_{ij}$ connected to the bit line $B_i$ through the fuse $f_{ij}$ for $i=1, \ldots N$; $j=1, \ldots M$ and the base of $x_{ij}$ connected to the word line $W_j$ for $i=1, \ldots N$; $j=1, \ldots M$.

The fuses $f_{ij}$ used in the memory array may be of any convenient type. For example, titanium-tungsten, nickelchromium, doped polycrystalline silicon, metal alloyed polycrystalline silicon, semiconductor junction fuses, and the like, are used in various embodiments.

Each bit line $B_i$ is connected to the emitter of a diode connected transistor $D_i$ having an emitter $TE_i$, a collector $TC_i$, and a base $TB_i$ whose collector $TC_i$ and base $TB_i$ are connected to a common terminal T for receiving a test voltage and whose emitter $TE_i$ is connected to the collector of a y-decode transistor $Y_i$, for $i=1, \ldots N$.

Each word line $W_j$ is connected to the emitter of an x-decode transistor $x_j$, having an emitter $Ex_j$, a collector $Cx_j$, and a base $Bx_j$ for $j=1, \ldots, M$, and to the anode of decode diode $D_j^*$, for $j=1, \ldots, M$, the cathode of said decode diode being connected to the collector of an output transistor $F_1$ of an input buffer, the emitter of said output transistor $F_1$ being connected to ground, and the base of said output transistor $F_1$ being connected to the remainder of the input buffer circuitry (not shown).

A constant current source $CS_j$ is connected across the collector-base junction of each transistor $x_j$ to provide base drive to each transistor $x_j$ for $j=1, \ldots M$.

Each base $Bx_j$ is connected to the anode of diode $D'_j$ whose cathode is connected to the cathode of $D_j^*$ for $j=1, \ldots, M$. A clamp transistor $C_i$ has its emitter connected to an associated bit line $B_i$ for $i=1, \ldots N$.

In one embodiment, a 10K resistor R is connected in series between the terminal T for receiving a test voltage and the anode of diode PD1 whose cathode is connected to the anode of diode PD2 whose cathode is connected to ground. The magnitude of the resistance of the resistor R is selected to appropriately limit the current flowing through diodes PD1 and PD2.

In another embodiment, the cathode of diode PD2 is connected to a means S for receiving a second voltage other than ground.

In another embodiment, the resistor R alone is connected between the terminal T and a terminal S for receiving a reference voltage.

Testing for shorts or leakage in the memory array A shown in FIG. 2 is performed in the following manner.

First, the clamp transistors $C_i$ for $i=1, \ldots N$ are turned off by raising the voltage on the base of the PNP transistors $C_i$ above the voltage required to turn the transistor on;

Next, the NPN Y-decode transistors $Y_i$ for $i=1, \ldots, N$, are turned off by pulling their bases below the voltage required to turn the transistors on, thus preventing any of the bit lines $B_I$ through $B_N$ from being selected;

Then, the X-decode is disabled by pulling the voltage on all of the word lines down through the decode diodes $D_j^*$ for $j=1, \ldots, M$ and the output transistor $F_1$ of an input buffer (not shown).

Next, a test voltage is applied to the terminal T, and

Finally, the current flowing into the terminal T is measured and the current flowing from terminal T through the PROM array is calculated.

To perform the test for the embodiment shown in FIG. 2, a positive 3 volts is applied by voltage source VS to the terminal T. The presence or absence of a short in one of the transistors $x_{ij}$ or between a word line and a bit line is determined by the amount of current flowing into the terminal T.

For a good memory with no shorts or leakage, current will flow from the terminal only through the 10 K resistor R, and through the diodes PD1 and PD2 to ground. Assuming a 0.8 voltage drop across each of forward biased diodes PD1 and PD2, the value of the current going into the terminal measured at 3 V is:

$$I_{(3v)} = \frac{(3.0 - 0.8 - 0.8)}{10,000 \text{ ohms}} \text{ volts} = 140 \, \mu A$$

Figure 3:
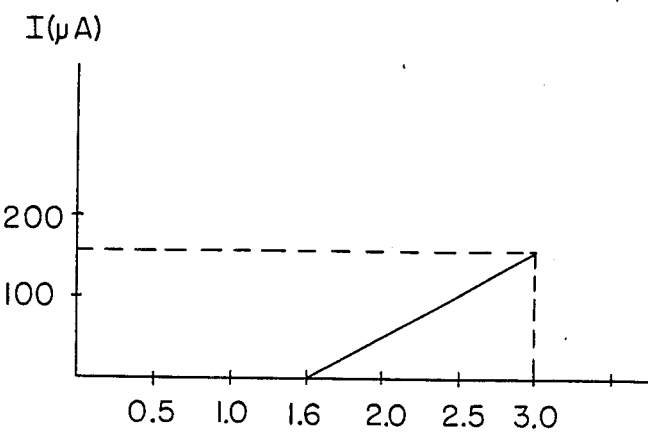
FIG. 3 shows the current-voltage (I-V) characteristic curve of the circuit shown in FIG. 2 with no shorts or leakage.

The I-V characteristic curve for the circuit of FIG. 2 which has no shorts or leakage is shown in FIG. 3, and has a slope equal to the reciprocal of the value of resistor R. Current begins to flow into the terminal T when the voltage applied to T is approximately 1.6 volts, which is the minimum voltage required to turn on the diodes $PD_1$ and $PD_2$.

Figure 4:
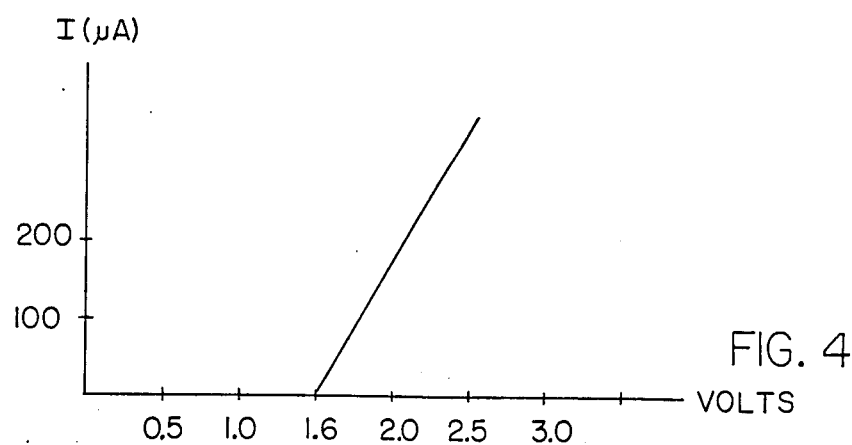
FIG. 4 shows the I-V characteristic curve of the circuit shown in FIG. 2 with massive emitter-base (EB) leakage.

If there is emitter-base (EB) leakage in any transistor $x_{ij}$ in the array but no EB short nor metal short in the array, current will flow also from terminal T through array, diode $D_i$, through the EB leak in $x_{ij}$, through decode diode $D_j^*$ and finally through input buffer Fl to ground. The amount of leakage current flowing into the terminal T depends on how many array transistors leak and how much each leaks. A typical I-V characteristic curve for the circuit shown in FIG. 2 which has EB leakage in one or more array transistors $x_{ij}$ but no EB shorts or metal shorts in the array is shown in FIG. 4. It is similar to FIG. 3, except that the current flowing into terminal T is higher than it should be for a good memory, and the slope of the curve is no longer equal to the reciprocal of the value of resistor R. The slope is equal to $(1/R) + (1/R_1)$ where $R_1$ is the effective resistance of the parallel current path from the terminal T through the leak or leaks to buffer transistor $F_1$ to ground. Again current begins to flow when the voltage applied to T is approximately 1.6 volts, the minimum voltage required to turn on diode $D_i$ and decode diode $D_j^*$ and provide the saturation voltage of transistor $F_1$ or alternatively the minimum voltage required to turn on diodes $PD_1$ and $PD_2$. This sort of leakage may have an effect on the programming yield and $T_{AA}$ (address access time).

Figure 5:
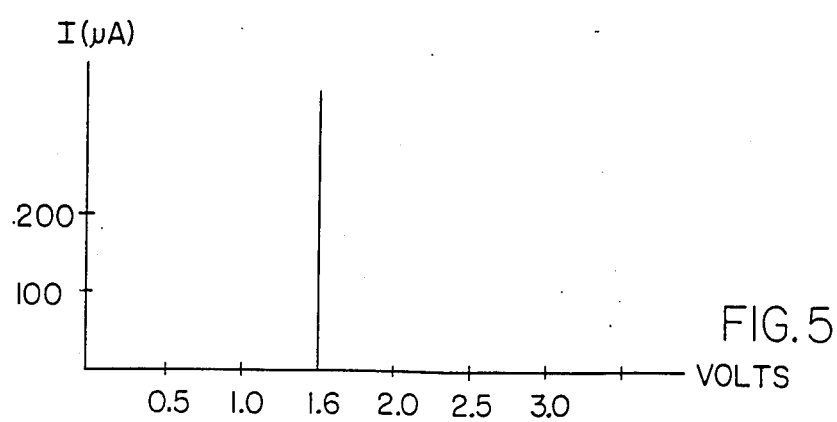
FIG. 5 shows the I-V characteristic curve of the circuit shown in FIG. 2 with an emitter-base short or a short between a word line and a bit line.

If an EB short or bit line to word line short occurs in the array shown in FIG. 2, current from the terminal T will flow through at least one forward biased diode $D_i$ through the short or shorts, through at least one decode diode $D_j^*$ and through input buffer transistor $F_1$ to ground. The I-V characteristic for the circuit of FIG. 2 in which there is an EB short in an array transistor or a short between a word line and a bit line is shown in FIG. 5. Of importance, the current will be much higher than in either of the two previous cases. This occurs because there is a low resistance path from the terminal T through the short or shorts, and then through $F_1$ to ground. Again, the slope of the curve is given by $1/R + 1/R_1$ where $R_1$ is the effective resistance of the low resistance path.

Devices with EB shorts and/or a short between a word line and a bit line will be rejected during the testing phase of production.

Devices having excessive EB leakage will also be rejected. Limits for allowable leakage depend on the size of the device, and there will, of course, always be nominal leakage in the PROM array. The ultimate test for allowable leakage is whether the device is programmable, which may be established by testing. In a typical PROM containing an array of NPN transistors, a workable first approximation may be to reject dice with leakage of 5 times nominal leakage.

It will be clear to one of ordinary skill in the art that various substitutions and modifications may be made in the testing circuitry described herein without departing from the spirit and scope of the invention. In particular, one may modify the circuitry so that memory cells on selected word lines or selected bit lines are tested or so that selected memory cells are tested individually.

I claim:

1. A semiconductor device comprising:
   a programmable cell including a programmable element and a bipolar transistor coupled to said programmable element, said bipolar transistor having first and second current-carrying leads and a control lead, said first current-carrying lead being coupled to said programmable element; and
   means for applying a test voltage to said first current-carrying lead of said bipolar transistor relative to said control lead of said bipolar transistor to thereby reverse-bias the junction between said first current carrying lead and said control lead and, and for determining whether current through said first current-carrying lead indicates the presence of shorts or leakages so as to render said semiconductor device unacceptable.

2. The semiconductor device of claim 1 wherein said programmable element is a fuse coupled to said transistor, whereby current from said transistor can be used to open said fuse.

3. The semiconductor device of claim 1 wherein said first and second current carrying leads comprise emitter and collector leads, respectively.

4. A method for testing a semiconductor device, said semiconductor device including a fuse and programming means having a programming lead coupled to said fuse, said programming means being capable of providing a programming current on said programming lead to thereby open said fuse, said method comprising the steps of:
   applying a voltage to said programming lead; and
   sensing the current flowing through said programming lead to thereby detect the presence of shorts or leakages in said semiconductor device, wherein said programming means is a bipolar transistor having an emitter coupled to said fuse, said voltage applied to said programming lead reverse-biasing the base-emitter junction of said bipolar transistor, whereby said sensed current is indicative of the presence of shorts or leakages across said base-emitter junction.

5. A method for testing a semiconductor device, said semiconductor device comprising a programmable element and means for programming said programmable element, said means for programming comprising a bipolar transistor having a current-carrying lead coupled to said programmable element and a control lead, said method comprising the steps of:
   applying a voltage to said current-carrying lead of said bipolar transistor to reverse-bias the junction between said current-carrying lead and said control lead; and
   sensing the current flowing through said current-carrying lead to thereby detect shorts or leakages in said semiconductor device.

6. The method of claim 5 wherein said step of sensing the current is performed to detect shorts or leakages across the base-emitter junction of said bipolar transistor.

7. In a programmable semiconductor device comprising at least one programmable cell comprising a bipolar transistor and a fuse, a method of detecting shorts and leakages in said programmable cell comprising the steps of:
   applying a voltage to said programmable cell so that the base-emitter junction of said bipolar transistor becomes reverse biased;
   measuring the current carried through said at least one cell; and
   using said measured current to determine the presence of shorts or leakages in said cell.

8. In a programmable semiconductor device having at least one data lead and comprising at least one programmable cell in turn comprising a transistor having a base, an emitter, and a collector and also having a fuse connected in series between said emitter and said data lead, a method for determining acceptability of said at least one programmable cell comprising the steps of:
   applying a range of voltages to said programmable cell sufficient to allow detection of shorts and leakages in said cell but not sufficient to open said fuse; and
   determining from the current carried by said at least one cell in response to said range of voltages whether said shorts and leakages are present to a degree which makes said semiconductor device unacceptable.

* * * * *